(12) United States Patent
Hashimoto et al.

(10) Patent No.: US 6,586,119 B1
(45) Date of Patent: *Jul. 1, 2003

(54) LUMINESCENT DEVICE

(75) Inventors: Yuichi Hashimoto, Tokyo (JP);
Akihiro Senoo, Tokyo (JP); Yomishi Toshida, Kanagawa (JP); Kazunori Ueno, Kanagawa (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 46 days.

(21) Appl. No.: 09/080,356

(22) Filed: May 18, 1998

(30) Foreign Application Priority Data

May 19, 1997 (JP) .............................. 9-142960

(51) Int. Cl.⁷ .............................. H05B 33/12
(52) U.S. Cl. .................. 428/690; 428/212; 428/917; 313/504; 313/506; 257/40; 257/94
(58) Field of Search ................. 428/690, 691, 428/917, 212; 313/504–509; 257/40, 94, 103

(56) References Cited

U.S. PATENT DOCUMENTS

| | | | |
|---|---|---|---|
| 3,172,862 A | 3/1965 | Gurnee et al. | 252/301.3 |
| 3,173,050 A | 3/1965 | Gurnee | 313/108 |
| 3,710,167 A | 1/1973 | Dresner et al. | 313/108 |
| 4,356,429 A | 10/1982 | Tang | 313/503 |
| 4,539,507 A | 9/1985 | VanSlyke et al. | 313/504 |
| 4,720,432 A | 1/1988 | VanSlyke et al. | 428/457 |
| 5,093,698 A * | 3/1992 | Egusa | |
| 5,343,050 A * | 8/1994 | Egusa et al. | 257/40 |
| 5,354,385 A | 10/1994 | Hashimoto et al. | 136/259 |
| 5,399,936 A | 3/1995 | Namiki et al. | 313/504 |
| 5,596,208 A * | 1/1997 | Dodabalapur et al. | |
| 2002/0014833 A1 | 2/2002 | Wada et al. | 313/504 |
| 2002/0064683 A1 | 5/2002 | Okada et al. | 428/690 |

FOREIGN PATENT DOCUMENTS

| | | |
|---|---|---|
| EP | 390 551 | 10/1990 |
| JP | 59-194393 | 11/1984 |
| JP | 3-163188 | 7/1991 |
| JP | 3-173095 | 7/1991 |
| JP | 3-264692 | 11/1991 |

OTHER PUBLICATIONS

The Journal of Chemical Physics, "Transients of Volume–Controlled Current and of Recombination Radiation in Anthraces", W. Helfrich et al., vol. 43, No. 8, Apr. 1964, pp. 2902–2909.

Chemical Physics Letters, "Magnetic Field Effects on Recombination Radiation in Tetracene Crystal", J. Kalinowski et al., vol. 36, No. 3, Nov. 1975, pp. 345–348.

Polymer, "Electroluminescence From Polyvinylcarbazole Films: 3. Electroluminescent Devices", R.H. Partridge, Division of Electrical Science Physical Laboratory, Tedington, Middlesex, UK, vol. 24, Jun. 1983, pp. 748–754.

(List continued on next page.)

Primary Examiner—Marie Yamnitzky
(74) Attorney, Agent, or Firm—Fitzpatrick, Cella, Harper & Scinto

(57) ABSTRACT

A luminescent device in accordance with the present invention includes an anode, a cathode, and an organic layer containing at least one organic compound provided therebetween. The work function of the anode (Wf(anode)) and the Fermi level of the organic layer (Ef(anode)) being in contact with the anode satisfies the following equation (I):

$$Ef(anode) - 0.2 \leq Wf(anode) \leq Ef(anode) + 0.2 [eV] \qquad (I)$$

9 Claims, 3 Drawing Sheets

OTHER PUBLICATIONS

International Journal on the Science and Technology of Thin and Thick Films, "Thin Solid Films", vol. 94, No. 2, Aug. 13, 1982, pp. 171–183.

The Journal of Chemical Physics, "Charge Transfer Exciton Fission in Anthracene Crystals", H.P. Schwob et al., vol. 58, No. 4, Feb. 15, 1973, pp. 1542–1547.

"Organic Electroluminescent Diodes", C.W. Tang et al., Sep. 21, 1987, Appl. Phys. Lett. 51 (12), pp. 913–915.

Applied Physics Letters, "Lateral Solid Phase Epitaxy of Amorphous Si Films Onto Nonplanar $SiO_2$ Patterns on Si Substrates", Hiroshi Ishiwara et al., vol. 48, No. 12, Mar. 24, 1986, pp. 773–775.

Physical Review Letters, "Recombination Radiation in Anthracene Crystals", W. Helfrich et al., vol. 14, No. 7, Jan. 15, 1965, pp. 229–231.

Letters to the Editor, "Electroluminescence in Organic Crystals", M. Pope et al., vol. 38, 1963, pp. 2042–2043, (no month).

K. Yanagida et al., "Low–Energy Electronic States Related to Contact Electrification of Pendant–Group Polymers: Photoemission and Contact Potential Difference Measurement", Jpn. J. Appl. Phys., vol. 32, Pt. 1, No 12A, pp. 5603–5610, Dec. 1993.

K. Yamasaki et al., "Carrier Injection behavior at the interface between CGL and CTL", Materials Research Lab., Fuji Xerox Co., Ltd., pp. 225–228 (Abstract). Date not given.

K. Yanagida et al., "A mechanistic study for chemical sensitization of OPC containing two charge generation materials; Work function Difference Induced Exciton Dissociation Model", Materials Research Lab., Fuji Xerox Co., Ltd., pp. 169–172 (Abstract). Date not given.

* cited by examiner

LUMINESCENT DEVICE

BACKGROUND OF THE INVENTION

1. Field of the Invention

The present invention relates to luminescent devices which have a luminescent layer containing a luminescent material and which directly convert applied electrical energy into optical energy. In particular, the present invention relates to a thin, light and solid luminescent device with a large luminescent area and high resolution, enabling high-speed operation. Such a luminescent device is quite different from conventional incandescent lamps, fluorescent lamps, and light emitting diodes (LEDs), and can be used for electroluminescence panels which are expected as devices satisfying advanced needs in various industrial fields.

2. Description of the Related Art

Pope et al. first discovered an electroluminescence (EL) of an organic material, that is, single-crystal anthracene, in 1963 (J. Chem. Phys., 38, 2042 (1963)). Helfinch and Schneider succeeded with observation of relatively strong EL in an injection EL material containing a solution system having a high injection efficiency in 1965 (Phys. Rev. Lett., 14, 229 (1965)). Many studies of organic luminescent materials containing conjugated organic hosts and conjugated organic activators having condensed benzene rings have been disclosed in U.S. Pat. Nos. 3,172,862, 3,173,050, and 3,710,167; J. Chem. Phys., 44, 2902 (1966); J. Chem. Phys., 58, 1542 (1973); and Chem. Phys. Lett., 36, 345 (1975). Examples of disclosed organic hosts include naphthalene, anthracene, phenanthrene, tetracene, pyrene, benzpyrene, chrysene, picene, carbazole, fluorene, biphenyl, terphenyl, triphenylene oxide, dihalobiphenyl, trans-stilbene, and 1,4-diphenylbutadiene. Examples of disclosed activators include anthracene, tetracene and pentacene. Since these organic luminescent materials are provided as single layers having a thickness of more than 1 μm, a high electric field is required for luminescence. Under these circumferences, thin film devices formed by a vacuum deposition process have been proposed (for example, "Thin Solid Films", p. 94 (1982); Polymer, 24, 748 (1983); and J. Appl. Phys., 25, L773 (1986)). Although the thin film devices are effective for reducing the driving voltage, their luminance is far from a level sufficient for practical use.

In recent years, Tang et al. have developed an EL device having a high luminance for a low driving voltage (Appl. Phys. Lett., 51, 913 (1987) and U.S. Pat. No. 4,356,429). The EL device is fabricated by depositing two significantly thin layers, that is, a charge transport layer and a luminescent layer, between the anode and the cathode by a vacuum deposition process. Such layered organic EL devices are disclosed in, for example, Japanese Patent Laid-Opens Nos. 59-194393, 3-264692, and 3-163188, U.S. Pat. Nos. 4,539, 507 and 4,720,432, and Appl. Phys. Lett., 55, 1467 (1989).

Also, an EL device of a triple-layered structure having independently a carrier transport function and a luminescent ability was disclosed in Jpn. J. Apply. Phys., 27, L269 and L713 (1988). Since the carrier transportability is improved in such an EL device, the versatility of possible dyes in the luminescent layer is considerably increased. Further, the device configuration suggests feasibility of improved luminescence by effectively trapping holes and electrons (or excimers) in the central luminescent layer.

Layered organic EL devices are generally formed by vacuum deposition processes. EL devices having considerable luminance are also formed by casting processes (as described in, for example, Extended Abstracts (The 50th Autumn Meeting (1989), p. 1006 and The 51st Autumn Meeting (1990), p. 1041; The Japan Society of Applied Physics). Considerably high luminance is also achieved by a single-layered mixture-type EL device, in which the layer is formed by immersion-coating a solution containing polyvinyl carbazole as a hole transport compound, an oxadiazole derivative as an electron transport compound and coumarin-6 as a luminescent material (as described in Extended Abstracts (The 38th Spring Meeting (1991), p. 1086; The Japan Society of Applied Physics and Related Societies).

As described above, the organic EL devices have been significantly improved and have suggested feasibility of a wide variety of applications; however, these EL devices have some problems for practical use, for example, insufficient luminance, a change in luminance during use for a long period, and deterioration by atmospheric gas containing oxygen and humidity. Further, it is hard to say that the EL devices sufficiently satisfy needs of diverse wavelengths of luminescent light for precisely determining luminescent hues of blue, green and red colors in full-color displays etc.

SUMMARY OF THE INVENTION

It is an object of the present invention to provide a luminescent device having high output luminance for solving the above-mentioned problems.

It is another object of the present invention to provide a luminescent device having excellent durability.

It is a further object of the present invention to provide a luminescent device easily produced at relatively low production costs.

A luminescent device in accordance with the present invention includes an anode, a cathode, and an organic layer containing at least one organic compound provided therebetween, wherein the work function of the anode $Wf(anode)$ and the Fermi level of the organic layer ($Ef(anode)$) upon contact with the anode satisfy the following equation (I):

$$Ef(anode)-0.2 \leq Wf(anode) \leq Ef(anode)+0.2 [eV] \quad (I)$$

Preferably, the work function of the cathode ($Wf(cathode)$) and the Fermi level of the organic layer ($Ef(cathode)$) upon contact with the cathode satisfy the following equation (II):

$$Wf(cathode) \leq Ef(cathode) [eV] \quad (II)$$

The luminescent device satisfying equation (I) or (II) can produce light with significantly high luminance by a low applied voltage and has excellent durability.

A luminescent device with a large area can be easily formed by a vacuum deposition or casting process with low production costs.

DESCRIPTION OF THE PREFERRED EMBODIMENT

The present inventors have studied intensively towards the resolution of the above-mentioned problems, and have discovered a preferable luminescent device including an anode, a cathode, and an organic layer containing at least one organic compound provided therebetween, the work function of the anode (Wf(anode)) and the Fermi level of the organic layer (Ef(anode)) upon contact with the anode satisfying the following equation (I) and more preferably also equation (II):

$$Ef(\text{anode}) - 0.2 \leq Wf(\text{anode}) \leq Ef(\text{anode}) + 0.2 [eV] \qquad (I)$$

$$Wf(\text{cathode}) \leq Ef(\text{cathode}) [eV] \qquad (II)$$

The present invention was completed on the basis of findings.

In the present invention, the work functions of the anode and the cathode, Wf (anode) and Wf(cathode), respectively, are determined from thresholds of photoelectron emission with a surface analyzer AC-1 made by Riken Keiki Co., Ltd. The Fermi levels of the organic layer Ef(anode) and Ef(cathode) are determined by a contact potential method (Kelvin method) with a Fermi level meter FAC-1 made by Riken Keiki Co., Ltd. These measurements are performed in atmospheric conditions at a temperature of 20° C. and a humidity of 40%.

The luminescent device in accordance with the present invention will now be described in detail with reference to the drawings.

Figure 1:
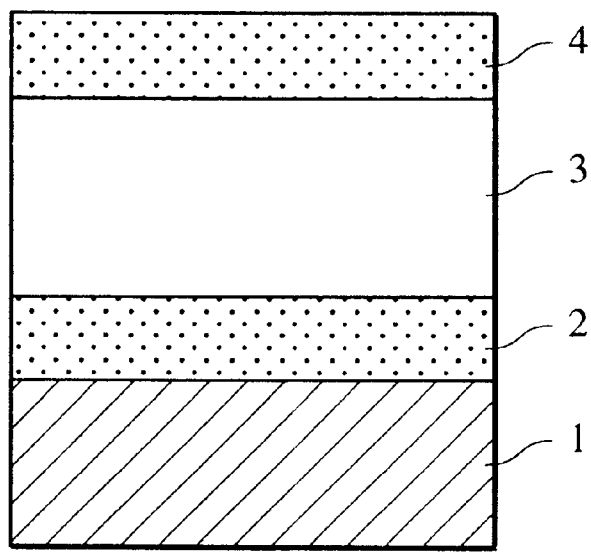
FIG. 1 is a cross-sectional view of an embodiment of a luminescent device in accordance with the present invention.

FIG. 1 is a schematic cross-sectional view of an embodiment of the luminescent device in accordance with the present invention. An anode 2, a luminescent layer 3 and a cathode 4 are formed on a substrate 1 in that order. In such a configuration, a usable luminescent layer 3 is generally composed of a single compound having hole transportability, electron transportability and luminescence, or a mixture of compounds each having one of these properties.

Figure 2:
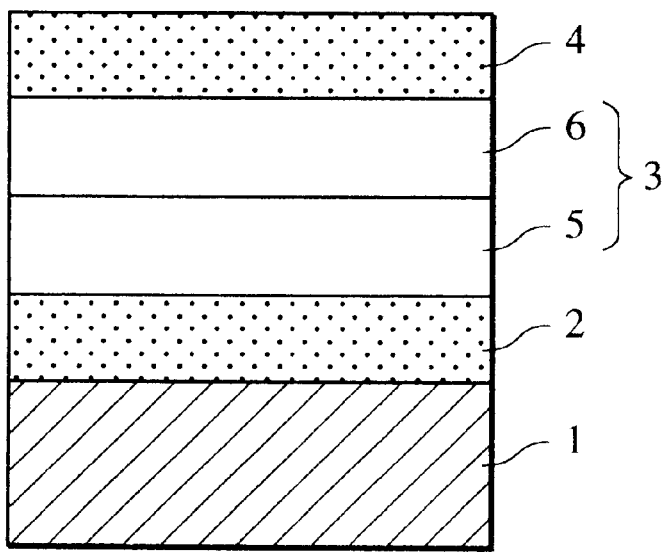
FIG. 2 is a cross-sectional view of another embodiment of a luminescent device in accordance with the present invention.

FIG. 2 is a schematic cross-sectional view of another embodiment of the luminescent device in accordance with the present invention. An anode 2, a hole transport layer 5, an electron transport layer 6 and a cathode 4 are formed on a substrate 1 in that order. The hole transport layer 5 and the electron transport layer 6 function as a luminescent layer 3. In such a configuration, a usable hole transport layer 5 is generally composed of a luminescent material having hole transportability or a mixture including such a material and a non-luminescent material having hole transportability. The luminescent and non-luminescent materials may also have electron transportability. The electron transport layer 6 may be composed of a luminescent material having electron transportability or a mixture including such a material and a non-luminescent material having electron transportability. The luminescent and non-luminescent materials may also have hole transportability.

Figure 3:
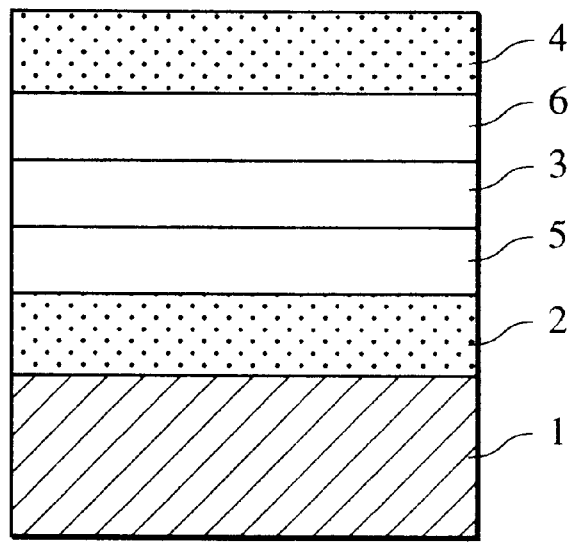
FIG. 3 is a cross-sectional view of a further embodiment of a luminescent device in accordance with the present invention.
Figure 4:
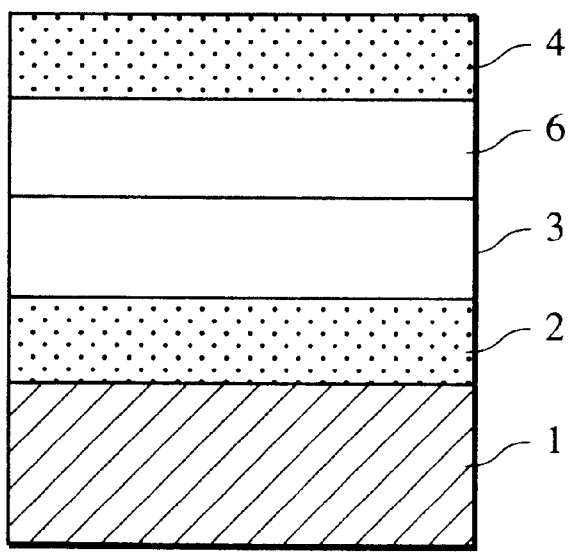
FIG. 4 is a cross-sectional view of still another embodiment of a luminescent device in accordance with the present invention.

FIG. 3 is a schematic cross-sectional view of a further embodiment of the luminescent device in accordance with the present invention. An anode 2, a hole transport layer 5, a luminescent layer 3, an electron transport layer 6 and a cathode 4 are formed on a substrate 1 in that order. FIG. 4 is a schematic cross-sectional view of a still further embodiment of the luminescent device in accordance with the present invention. An anode 2, a luminescent layer 3, an electron transport layer 6, and a cathode 4 are formed on a substrate 1 in that order. In these configurations, carrier transport and luminescence are performed in the individual layers. Such configurations permit a wide variety of combinations of a material having excellent hole transportability, a material having excellent electron transportability and a material having excellent luminescence. Further, the configurations permit the use of various compounds emitting light with different wavelengths; hence, the hue of the luminescent light can be controlled within a wide range. Effectively trapping holes and electrons (or excimers) in the central luminescent layer will increase the luminescent efficiency.

The luminescent device in accordance with the present invention has excellent hole injection and electron injection characteristics compared with conventional luminescent devices, and can have, e.g., any of the configurations shown in FIGS. 1 to 4.

Organic EL devices generally belong to carrier injection luminescence devices and their luminance greatly depends on the number of carriers, that is holes or electrons, injected from the relevant electrode. It is preferable that the whole number of the carriers injected from the anode or cathode be constant in use for a long time. Existing devices, however, deteriorate and cause imperfect electrical or physical matching between the electrodes and the relevant layer(s) in use over a long time. As a result, the output luminance significantly decreases because of a reduced number of injected carriers in the device.

The luminescent device satisfying equation (I) and preferably also satisfying equation (II) in accordance with the present invention shows an optimized electrical matching between the electrodes and the adjoining organic layer. A significantly large number of carriers are therefore injected through the electrodes even when in use for a long time, and a reduction in current flow through the device can be suppressed to the greatest extent possible even after long-term use.

The number of carriers injected from the electrodes of a series of luminescent devices in accordance with the present invention is observed as follows. These luminescent devices have the same layer configuration as in FIG. 4. Each cathode is composed of aluminum. The luminescent layer is composed of $Alq_3$ represented by the following formula:

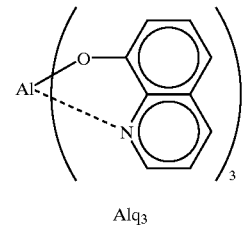

Alq₃

Each hole transport layer is composed of the compound represented by the following formula (a) and a polycarbonate resin (1:1 mixture by weight ratio):

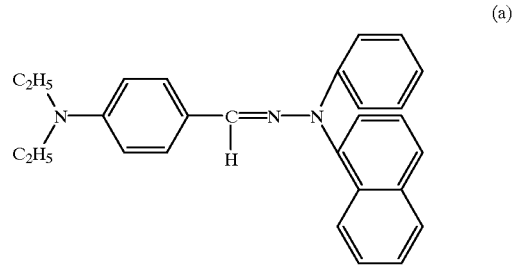

(a)

Figure 5:
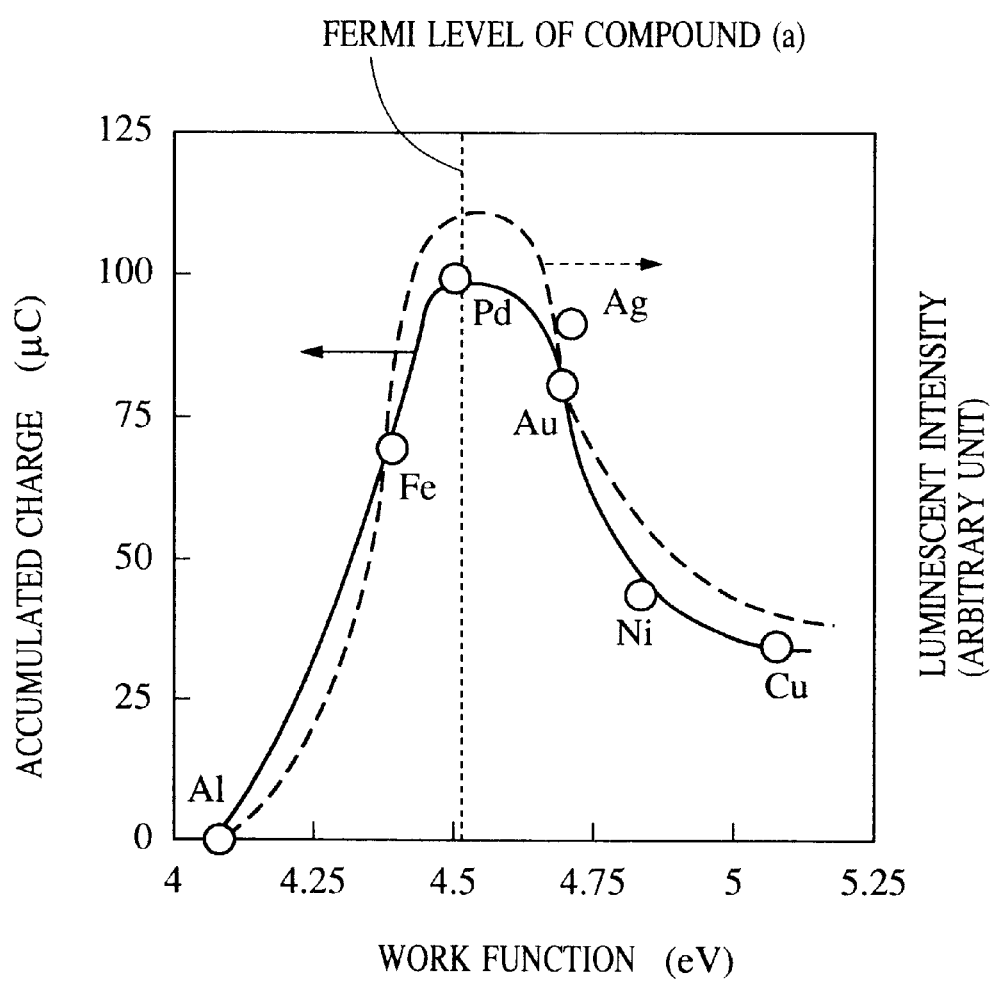
FIG. 5 is a graph illustrating changes in accumulated charge and intensity of luminescent light with the work function of the metal in the anode in accordance with the present invention.

Each anode is composed of any one of Al, Fe, Pd, Ag, Au, Ni and Cu, which have different work functions. The anode was formed so that it was translucent. The number of holes injected from the anode to the hole transfer layer and the intensity of the luminescent light were determined. The results are shown in the graph of FIG. 5. The horizontal axis of the graph represents the work function of the metal used in the anode. The work function was determined using a surface analyzer AC-1 made by Riken Keiki Co., Ltd. The accumulated charge by injected carriers at the vertical axis was determined with a spatial charge distribution analyzer PEANUTS made by Five Labs. Inc. The Fermi level of the hole transport layer determined with a Fermi level meter FAC-1 made by Riken Keiki Co., Ltd. was 4.52 eV.

FIG. 5 demonstrates that an anode having a work function within a range of ±0.2 eV from the Fermi level (4.52 eV) of the hole transport layer has an accumulated charge (an number of the injected holes) which is approximately 70% of the maximum value. The intensity of the luminescent light depends on the number of the injected holes. It is preferable that the anode has a work function within a range of ±0.1 eV from the Fermi level of the hole transport layer in order to achieve a larger intensity of the luminescent light. Since in such a luminescent device a large number of carriers are injected, the luminescent light has a high intensity, and the decrease in current flow in the device is not remarkable, even long-term use.

A slightly different phenomenon was observed between the electron transport layer and the cathode. A window accepting electrons from the cathode widely spreads near the Fermi level of the organic compound having electron transportability; hence the number of the injected carriers (electrons) and thus the luminescent intensity increase as the work function of the cathode becomes lower than the Fermi level of the electron transport layer.

As components of the luminescent layer in the luminescent device in accordance with the present invention, hole transport materials studied in the field of electrophotographic photosensitive members and known luminescent hole transport materials as shown in Tables 1 to 4 or electron transport materials and known luminescent electron transport materials as shown in Table 5 to 6 can be used. These materials are used alone or in combination.

TABLE 1

Hole Transport Compounds

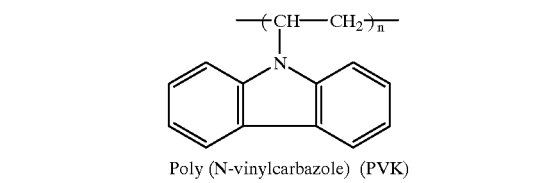

Poly (N-vinylcarbazole) (PVK)

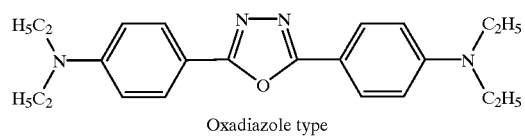

Oxadiazole type

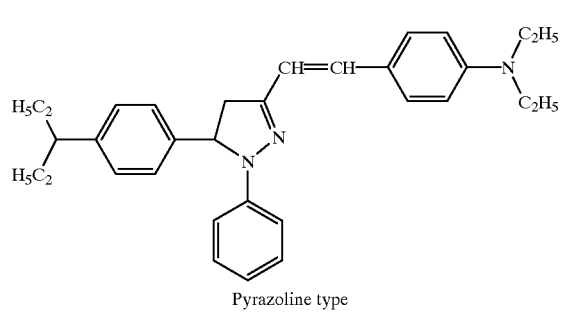

Pyrazoline type

TABLE 1-continued

Hole Transport Compounds

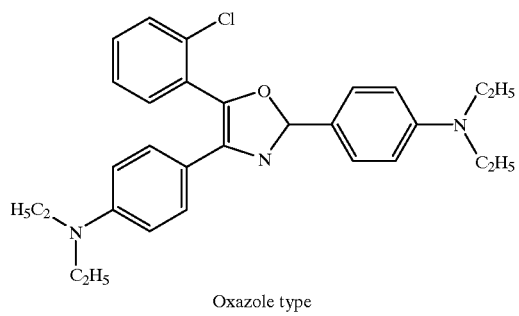

Oxazole type

TABLE 2

Hole Transport Compounds

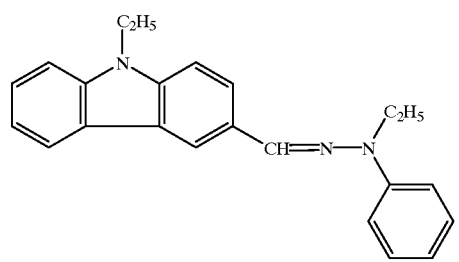

Hydrazone type

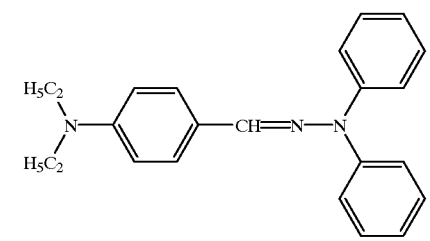

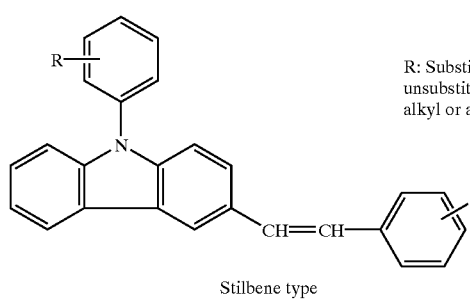

R: Substituted or unsubstituted alkyl or aryl

Stilbene type

TABLE 2-continued

Hole Transport Compounds

Triphenylamine type

TABLE 3

Hole Transport Compounds

Triphenylmethane type

Butadiene type

TABLE 4

Luminescent Hole Transport Compounds

TABLE 4-continued

Luminescent Hole Transport Compounds

TABLE 5

Electron Transport Compounds

TABLE 6

Luminescent Electron Transport Compounds

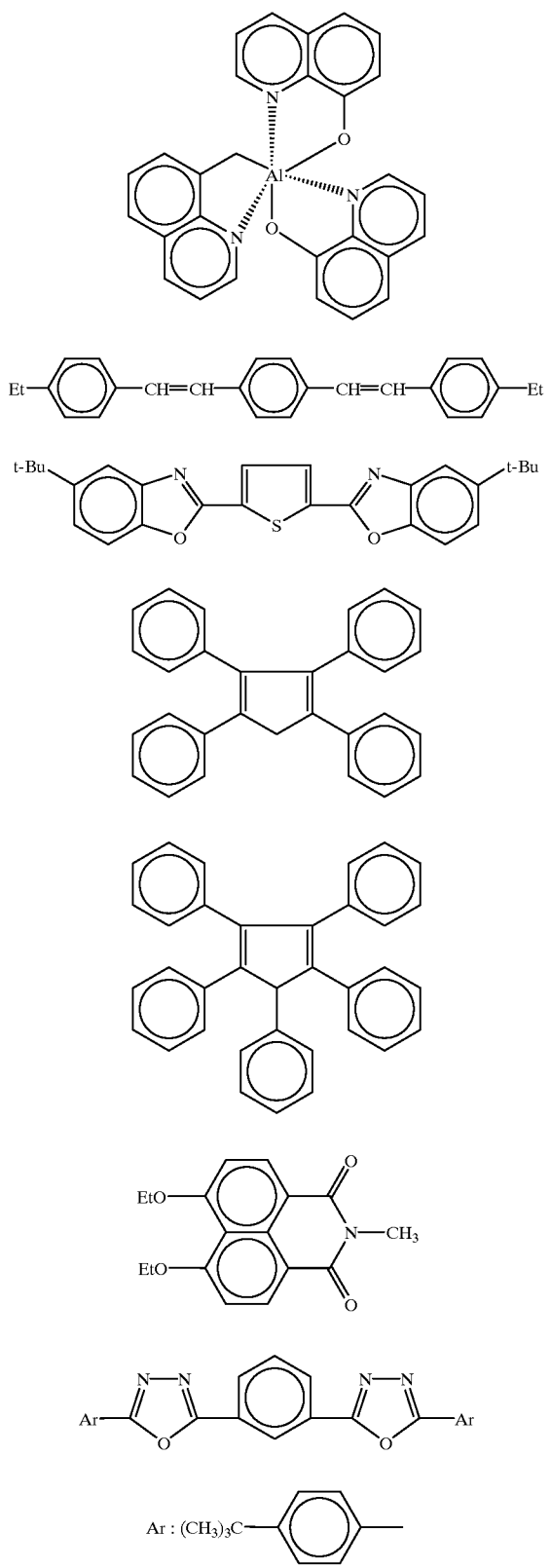

In the luminescent device in accordance with the present invention, the luminescent layer is generally formed by a vacuum deposition process or using a binding resin.

Non-limiting examples of the binding resins include polyvinyl carbazole resins, polycarbonate resins, polyester resins, polyarylate resins, butyral resins, polystyrene resins, polyvinyl acetal resins, diallyl phthalate resins, acrylate resins, methacrylate resins, phenol resins, epoxy resins, silicon resins, polysulfone resins, and urea resins. These binding resins can be used alone or in combination.

Preferable anode materials have large work functions. Examples of such materials include nickel, gold, platinum, palladium, selenium, rhenium, and iridium; alloys thereof; and tin oxide, indium tin oxide, and copper iodide. Conductive polymers, such as poly(3-methylthiophene), polyphenylene sulfide and polypyrrole are also usable.

In contrast, preferable cathode materials have small work functions. Examples of such materials include silver, lead, tin, magnesium, aluminum, calcium, manganese, indium and chromium, and alloys thereof.

It is preferable that at least one constituent of the anode and cathode transmits 50% or more of incident light over the wavelength region of the luminescent light.

As the transparent substrate, glass and plastic films are used in the present invention.

The luminescent device in accordance with the present invention is a thin, light and solid device with a large luminescent area and high resolution, enabling high-speed operation. Such a luminescent device is quite different from conventional incandescent lamps, fluorescent lamps, and light emitting diodes, and can be used for electroluminescence panels which are expected as devices satisfying advanced needs in industrial fields.

EXAMPLES

The present invention is described in further detail with reference to the following examples.

Examples 1 to 3, Comparative Examples 1 and 2

Luminescent devices of Examples 1, 2 and 3 were prepared as follows. Translucent or transparent anodes with a thickness of 50 nm composed of iron, silver and indium tin oxide (ITO), respectively were formed on glass plates by a deposition process. On each anode, a hole transport layer with a thickness 100 nm of the following compound (b), an electron transport layer with a thickness of 75 nm composed of $Alq_3$, and a cathode with a thickness of 120 nm composed of aluminum were formed in that order by a vacuum deposition process. The electron transport layer also functions as a luminescent layer.

(b)

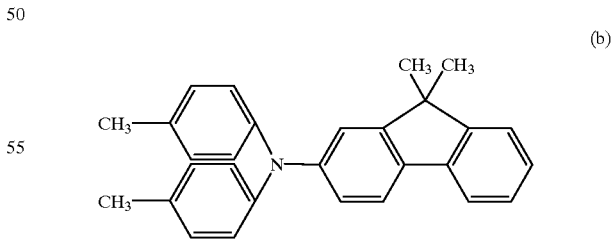

Luminescent devices of Comparative Examples 1 and 2 were also prepared as in Example 1, but the anode materials were zirconium and copper, respectively, and the cathode was composed of gold and had a thickness of 100 nm.

Table 7 shows the results of the work functions Wf (eV) of the anodes and the cathodes determined with the above-mentioned surface analyzer AC-1.

The Fermi levels of the films composed of the compound (b) and Alq$_3$ determined with the above-mentioned Fermi level meter FAC-1 were 4.63 eV and 4.70 eV, respectively.

A current flow of a current density of 20 mA/cm$^2$ was applied to the luminescent devices for 100 hours. The results are also shown in Table 7.

Luminescent devices of Comparative Examples 3 and 4 were also prepared as in Example 4, but the anode materials were zinc and nickel, respectively, and the cathode was composed of platinum and had a thickness of 125 nm.

Table 8 shows the results of the work functions Wf (eV)

TABLE 7

| | Cathode | | Anode | | Initial | | After 100 hours | |
|---|---|---|---|---|---|---|---|---|
| Sample | Metal | Wf (eV) | Metal | Wf (eV) | Applied Voltage (V) | Luminescent Output ($\mu$W/cm$^2$) | Applied Voltage (V) | Luminescent Output ($\mu$W/cm$^2$) |
| Example 1 | Al | 4.08 | Fe | 4.43 | 19 | 30 | 32 | 30 |
| Example 2 | Al | 4.08 | Ag | 4.71 | 13 | 40 | 17 | 37 |
| Example 3 | Al | 4.08 | ITO | 4.66 | 10 | 44 | 13 | 41 |
| Comp. Ex 1 | Au | 4.71 | Zr | 4.26 | 50 | None Luminescence | 64 | None Luminescence |
| Comp. Ex. 2 | Au | 4.71 | Cu | 5.08 | 55 | None Luminescence | 77 | None Luminescence |

Example 4 and 5, and Comparative Example 3 and 4

Luminescent devices of Examples 4 and 5 were prepared as follows. Translucent or transparent anodes with a thickness of 50 nm composed of ITO and molybdenum, respectively, were formed on glass plates by a deposition process. On each anode, a hole transport layer with a thickness 130 nm of the following compound (c), an electron transport layer with a thickness of 100 nm composed of titanyloxyphthalocyanine, and a cathode with a thickness of 120 nm composed of aluminum were formed in that order by a vacuum deposition process. The electron transport layer also functions as a luminescent layer.

of the anodes and the cathodes determined with the above-mentioned surface analyzer AC-1.

The Fermi levels of the films composed of the compound (c) and titanyloxyphthalocyanine determined with the above-mentioned Fermi level meter FAC-1 were 4.56 eV and 4.94 eV, respectively.

A current flow of a current density of 60 mA/cm$^2$ was applied to the luminescent devices for 100 hours. The results are also shown in Table 8.

TABLE 8

| | Cathode | | Anode | | Initial | | After 100 hours | |
|---|---|---|---|---|---|---|---|---|
| Sample | Metal | Wf (eV) | Metal | Wf (eV) | Applied Voltage (V) | Luminescent Output ($\mu$W/cm$^2$) | Applied Voltage (V) | Luminescent Output ($\mu$W/cm$^2$) |
| Example 4 | Al | 4.08 | ITO | 4.66 | 30 | 4.0 | 35 | 3.3 |
| Example 5 | Al | 4.08 | Mo | 4.36 | 38 | 3.0 | 48 | 1.9 |
| Comp. Ex 3 | Pt | 5.20 | Zn | 4.13 | 88 | None Luminescence | 108 | None Luminescence |
| Comp. Ex. 4 | Pt | 5.20 | Ni | 4.84 | 80 | None Luminescence | 98 | None Luminescence |

(c)

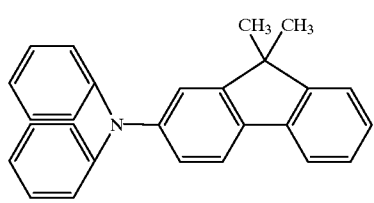

While the present invention has been described with reference to what are presently considered to be the preferred embodiments, invention is not limited to the disclosed embodiments. To the contrary, the invention is intended to cover various modifications and equivalent arrangements, included within the spirit and scope of the appended claims. The scope of the following claims is to be accorded the broadest interpretation so as to encompass all such modifications and equivalent structures and functions.

What is claimed is:

1. A luminescent device comprising an anode, a cathode, and an organic layer provided therebetween, wherein said organic layer has at least one hole transport layer that is in contact with the anode, wherein the work function of the anode (Wf (anode)) and the Fermi level of said hole transport layer (Ef (anode)) that is in contact with the anode satisfy the following relation:

$$Ef(\text{anode})-0.2 \leq Wf(\text{anode}) \leq Ef(\text{anode})+0.2 [eV]$$

and wherein the work function of the cathode (Wf (cathode)) and the Fermi level of the organic layer (Ef (cathode)) that is in contact with the cathode satisfy the following relation:

$$Wf(\text{cathode}) < Ef(\text{cathode}).$$

2. A luminescent device according to claim 1, wherein said organic layer is a laminated layer containing an electron transport layer and said hole transport layer, and said laminated layer constitutes a luminescent layer.

3. A luminescent device according to claim 1, wherein said organic layer is a laminated layer containing an electron transport layer which is a luminescent layer, and said hole transport layer.

4. A luminescent device according to claim 1, wherein said organic layer is a laminated layer containing said hole transport layer which is a luminescent layer, and an electron transport layer.

5. A luminescent device according to claim 1, wherein said anode is made of Fe, Pd, Au, Ag or ITO.

6. A luminescent device according to claim 1, wherein the work function of the anode (Wf(anode)) and the Fermi level of said hole transport layer (Ef(anode)) satisfy the following relation:

$$Ef(\text{anode})-0.1 eV < Wf(\text{anode}) < Ef(\text{anode})+0.1 \ eV.$$

7. A luminescent device according to claim 1, wherein the work function of the anode and the cathode are determined from thresholds of photoelectron emission.

8. A luminescent device according to claim 1, wherein the Fermi level of the organic layer Ef(anode) and Ef(cathode) are determined by a contact potential method.

9. A luminescent device according to claim 1, wherein the organic layer includes Alq3.

* * * * *